(12) United States Patent
Hamdan

(10) Patent No.: US 8,564,354 B2
(45) Date of Patent: Oct. 22, 2013

(54) CIRCUITS AND METHODS FOR LATCH-TRACKING PULSE GENERATION

(75) Inventor: Fadi Adel Hamdan, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 107 days.

(21) Appl. No.: 13/197,317

(22) Filed: Aug. 3, 2011

(65) Prior Publication Data

US 2013/0033292 A1    Feb. 7, 2013

(51) Int. Cl.
*G06F 1/04* (2006.01)
*H03K 3/00* (2006.01)

(52) U.S. Cl.
USPC ............ 327/291; 327/293; 327/294; 327/295

(58) Field of Classification Search
USPC ................. 327/165, 166, 291–299, 374, 178; 326/93–98; 716/6
See application file for complete search history.

(56) References Cited

U.S. PATENT DOCUMENTS

| 5,557,225 | A | 9/1996 | Denham et al. | |
|---|---|---|---|---|
| 6,326,829 | B1 | 12/2001 | Naffziger | |
| 6,437,602 | B1 * | 8/2002 | Friend et al. | 326/93 |
| 7,471,114 | B2 * | 12/2008 | Abadeer et al. | 326/95 |
| 7,557,616 | B2 * | 7/2009 | Klim et al. | 326/93 |
| 2004/0160257 | A1 | 8/2004 | Kim et al. | |
| 2006/0097754 | A1 | 5/2006 | Kim | |
| 2009/0108895 | A1 | 4/2009 | Saint-Laurent et al. | |

OTHER PUBLICATIONS

International Search Report and Written Opinion—PCT/US2012/049658—ISA/EPO—Nov. 9, 2011.

* cited by examiner

*Primary Examiner* — Lincoln Donovan
*Assistant Examiner* — Brandon S Cole
(74) *Attorney, Agent, or Firm* — Peter Michael Kamarchik; Nicholas J. Pauley; Joseph Agusta

(57) ABSTRACT

Circuits and methods for latch-tracking pulse generation across process, voltage and temperature (PVT) variations are disclosed. In one embodiment, the method includes receiving a clock input at a pulse generation circuit and generating a pulse at the pulse generation circuit in response to the clock input. The method further includes distributing the pulse to a mimic latch, which writes a mimic storage node through a mimic storage circuit of the mimic latch in response to the pulse. The method further includes terminating generation of the pulse at the pulse generation circuit in response to a transition of the mimic storage node. The method may include receiving a clock enable input at a pulse control circuit coupled to the pulse generation circuit and either suppressing or allowing generation of a pulse in response to a value of the clock enable input.

20 Claims, 5 Drawing Sheets

CIRCUITS AND METHODS FOR LATCH-TRACKING PULSE GENERATION

FIELD OF DISCLOSURE

The teachings of the present disclosure relate generally to pulser topologies, and in particular embodiments to a pulser topology that tracks latch behavior.

BACKGROUND

A pulser is a circuit that creates a pulse used to clock a latch and allow the latch to behave similar to an edge triggered, flip-flop. Pulser circuits are commonly designed to provide a specified pulse width in order to ensure that a latch coupled to the pulser reliably captures a data value over a desired range of process, voltage and temperature (PVT) variations (also referred to as corners).

An exemplary pulser 100 is illustrated in FIG. 1. The pulser 100 includes a pulse generation circuit 102 (in this instance, a NAND gate coupled to an inverter) and a delay chain 104 (in this instance a NAND gate followed by two inverters). A clock input 110 is coupled to both the pulse generation circuit 102 and the delay chain 104. An early enable input 112 is coupled to the NAND gate of the delay chain 104, and a late enable 114 is coupled to the NAND gate of the pulse generation circuit 102. When the pulser 100 is enabled by both the early enable input 112 and late enable input 114, the pulser 100 produces an output pulse 116 in response to the clock input 110. Either the early enable input 112 or the late enable input 114 may disable pulse generation under certain conditions, depending on timing constraints and other considerations.

In pulser designs, it is desirable that the pulse width provided by the pulser track the pulse width required to write the internal storage node of the latch across PVT corners. The delay chain 104 illustrated in FIG. 1 may not accurately track latch behavior across all PVT corners because the topology of the delay chain 104 is significantly different that the topology of the latch to which it is coupled. In this context, topology refers to the type of circuits and load capacitances in a particular circuit path. For example, the topology of the delay chain 104 includes a NAND gate and two inverters (mainly gate capacitance) whereas the topology of the latch may include a pass gate (mainly diffusion capacitance) and a storage element (mainly gate capacitance). To compensate for the difference in topology, the pulser 100 may be designed to provide a wider pulse 116 than is needed to write the latch at favorable PVT corners in order to guarantee writability of the latch at unfavorable PVT corners (for example, corners where P-type transistors (PMOS devices) are slow and N-type transistors (NMOS devices) are fast or vice versa). Although using a wider pulse allows for more robust pulse generation at unfavorable PVT corners, it may create hold-time issues in favorable PVT corners. Additionally, because the delay chain 104 may track differently across the PVT corners than the NAND gate of the pulse generation circuit 102, it is even possible that the pulse 116 may fail to be generated at all in some unfavorable PVT corners.

Lengthening the pulse in the case of the design illustrated in FIG. 1 may involve the addition of extra inverters to the delay chain 104, which increases the area and power consumption of the overall design. The location of a pulse enable input within the pulser circuit may also involve design tradeoffs. An early pulse enable may allow theoretically greater power savings but be difficult to use from a timing perspective, whereas a late pulse enable may be easier to use from a timing perspective but may provide less favorable power savings. For example, as can be seen in the exemplary pulser of FIG. 1, even when the pulser is disabled via the late enable 114, the entire delay chain 104 will still switch every clock cycle.

SUMMARY OF THE DISCLOSURE

In one embodiment, a pulser comprising a clock input, a pulse generation circuit, a mimic latch circuit and a pulser control circuit is disclosed. The pulse generation circuit is coupled to the clock input and a mimic storage node and is configured to generate a pulse in response to the clock input and the mimic storage node. The pulse generation circuit is configured to provide the pulse to the mimic latch circuit. The pulse generation circuit is configured to terminate generation of the pulse in response to a transition of the mimic storage node which indicates termination of pulse generation. The mimic latch circuit is coupled to the mimic storage node and is configured to cause the transition of the mimic storage node in response to the pulse. The pulser control circuit is coupled to the mimic storage node and is configured to reset the mimic storage node in response to the clock input.

In another embodiment, a method of pulse generation is disclosed. The method comprises receiving a clock input at a pulse generation circuit. The method further comprises generating a pulse at the pulse generation circuit in response to the clock input and distributing the pulse to a mimic latch. The method further comprises writing a mimic storage nod through a mimic storage circuit of the mimic latch in response to the pulse and terminating generation of the pulse at the pulse generation circuit in response to a transition of the mimic storage node.

In another embodiment, an apparatus, comprising a clock input, pulse generation means, mimic latch means and pulser control means is disclosed. The pulse generation means is coupled to the clock input and a mimic storage node and is configured to generate a pulse in response to the clock input and the mimic storage node. The pulse generation means is configured to provide the pulse to the mimic latch means. The pulse generation means is configured to terminate generation of the pulse in response to a transition of the mimic storage node which indicates termination of pulse generation. The mimic latch means is coupled to the mimic storage node and is configured to cause the transition of the mimic storage node in response to the pulse. The pulser control means is coupled to the mimic storage node and is configured to reset the mimic storage node in response to the clock input.

It is understood that other embodiments of the teachings herein will become apparent to those skilled in the art from the following detailed description, wherein various embodiments of the teachings are shown and described by way of illustration. As will be realized, the teachings herein are capable of other and different embodiments without departing from the spirit and scope of the teachings. Accordingly, the drawings and detailed description are to be regarded as illustrative in nature and not as restrictive.

BRIEF DESCRIPTION OF THE DRAWINGS

Various aspects of the teachings of the present disclosure are illustrated by way of example, and not by way of limitation, in the accompanying drawings, wherein.

DETAILED DESCRIPTION

It would be desirable to provide a pulser whose topology more closely resembles the topology of the circuit used to write the internal storage node of a latch. It would farther be desirable to provide a pulser that reduces the likelihood that a pulse will fail to be generated. It would also be desirable to reduce the amount of switching in the pulser when the pulser is not enabled. Each of these features may provide advantages in terms of robustness of operation across process, voltage and temperature (PVT) corners and power consumption.

The detailed description set forth below, in connection with the appended drawings, is intended as a description of various exemplary embodiments of the teachings of the present disclosure and is not intended to represent the only embodiments in which such teachings may be practiced. The detailed description includes specific details for the purpose of providing a thorough understanding of the teachings by way of illustration and as such, they should not be construed as limiting the invention to the examples given. It will be apparent to those skilled in the art that the teachings of the present disclosure may be practiced in a variety of ways. In some instances, well known structures and components are shown in block diagram form in order to avoid obscuring the concepts of the present disclosure.

Figure 1:
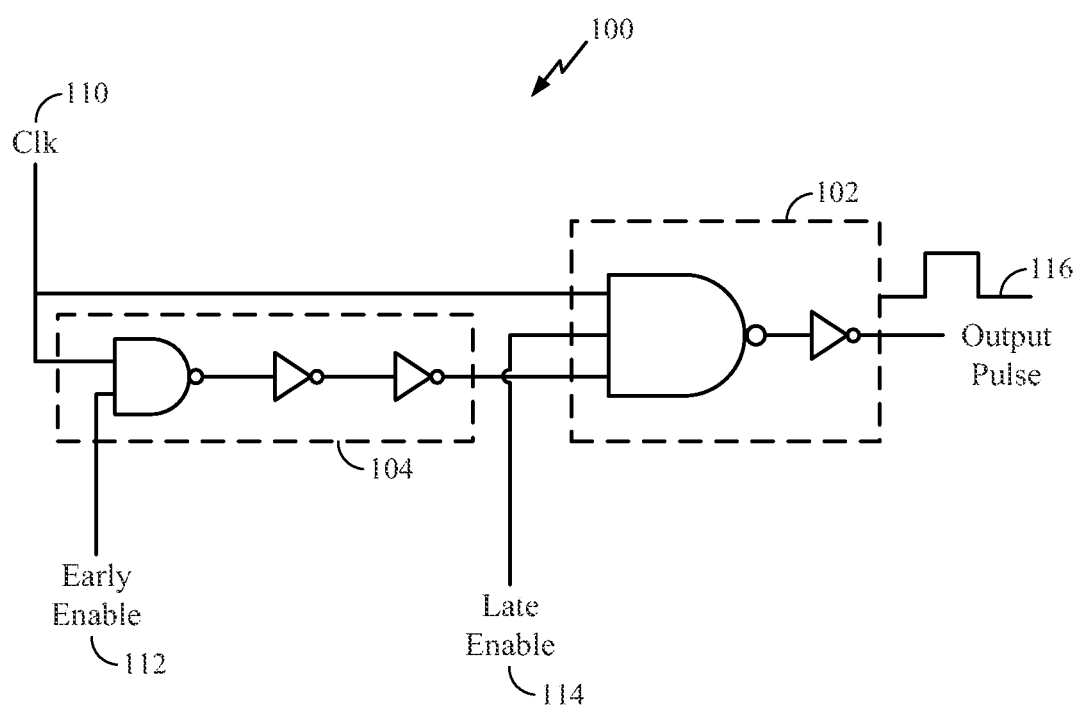
FIG. 1 is an circuit diagram of a pulser design.
Figure 2:
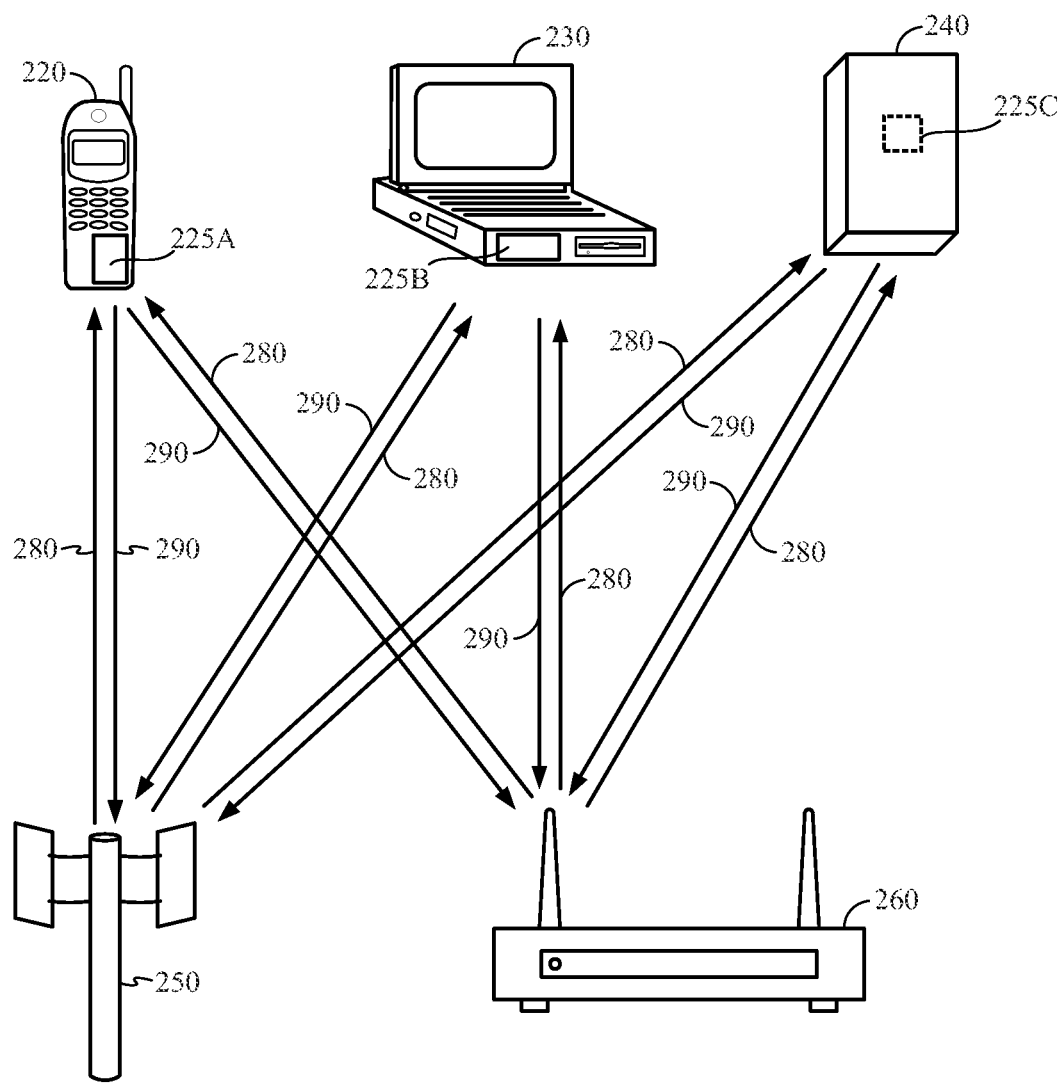
FIG. 2 is a diagram of a wireless system wherein embodiments of the present disclosure may be employed.

FIG. 2 shows an exemplary wireless communication system 200 in which embodiments of the present disclosure may be advantageously employed. For purposes of illustration, FIG. 2 shows three remote units 220, 230, and 240 and two base stations 250 and 260. It will be recognized that wireless communication systems may have many more remote units and base stations. Remote units 220, 230, and 240 include semiconductor die packages 225A, 225B, and 225C, respectively, which may include embodiments of the pulser topology discussed further below. FIG. 2 shows forward link signals 280 from the base stations 250 and 260 and the remote units 220, 230, and 240 and reverse link signals 290 from the remote units 220, 230, and 240 to base stations 250 and 260.

In FIG. 2, remote unit 220 is shown as a mobile telephone, remote unit 230 is shown as a portable computer, and remote unit 240 is shown as a computer in a wireless local loop system. For example, the remote units may be mobile phones, hand-held, personal communication systems (PCS) units, portable data units such as personal data assistants, GPS enabled devices, navigation devices, set top boxes, media players, such as music players, video players, and entertainment units, fixed location data units such as meter reading equipment, or any other device that stores or retrieves data or computer instructions, or any combination thereof, and accordingly is not limited to the exemplary illustrated units of FIG. 2. The disclosure may be suitably employed in any device which includes pulse latches, whether or not in a wireless communication system.

Figure 3A:
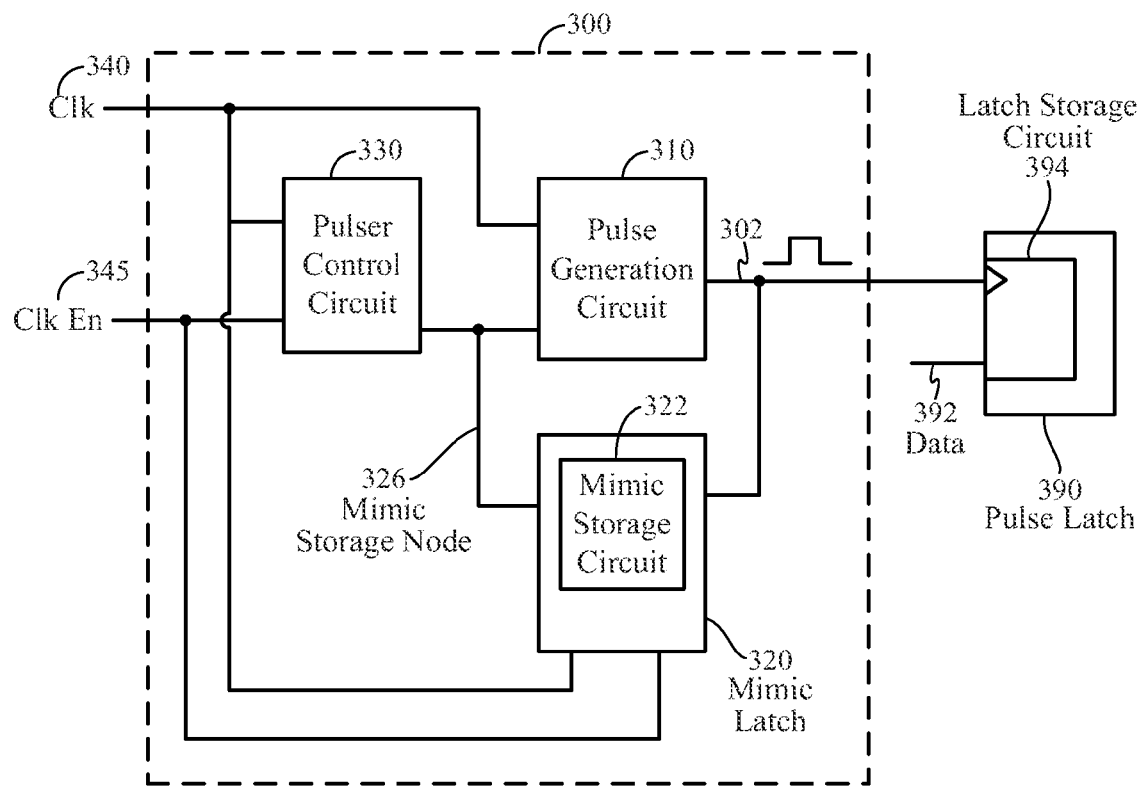
FIG. 3A is a block diagram of a system including a pulser according to one embodiment.

FIG. 3A illustrates an exemplary system comprising a pulser 300 coupled to a pulse latch 390. The pulser 300 receives a clock input 340 and a clock enable input 345 and is configured to provide an output pulse 302 to the pulse latch 390 in order to allow the pulse latch 390 to capture the value of data 392 at a latch storage circuit 394. The pulser 300 comprises a pulse generation circuit 310, a mimic latch 320 and a pulser control circuit 330.

Figure 3B:
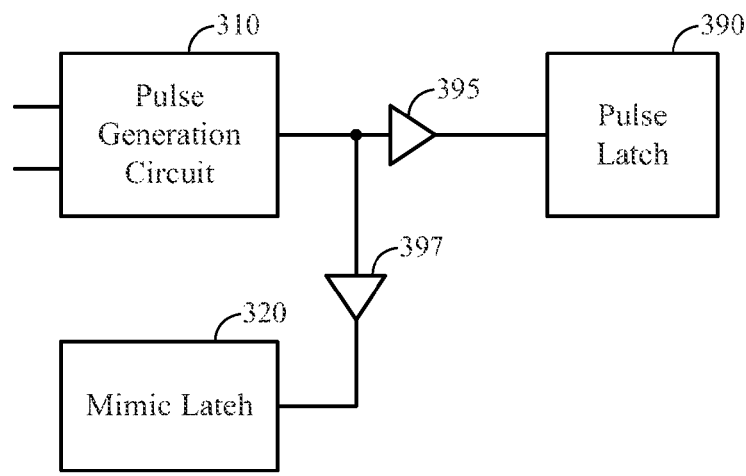
FIG. 3B is a block diagram of circuit path from a pulse generation circuit to a pulse latch and a mimic latch in accordance with one embodiment.

The pulse generation circuit 310 is coupled to the clock input 340, and is coupled to the mimic latch 320 and the pulser control circuit 330 via a mimic storage node 326. The mimic latch 320 has a topology which is substantially similar to the pulse latch 390 and mimics the characteristics of the pulse latch 390. The pulse generation circuit 310 generates the output pulse 302 which is distributed to the pulse latch 390 and the mimic latch 320. Although in the present embodiment the output pulse 302 is illustrated as being provided directly from the pulse generation circuit 310 to the pulse latch 390 and the mimic latch 320, it need not be. For instance, in other embodiments inverters, buffers or other circuits may be included to distribute the output pulse 302 from the pulse generation circuit to the pulse latch 390 and the mimic latch 320. In one embodiment, the pulse 302 is distributed to the pulse latch 390 and the mimic latch 320 along circuit paths having singular topologies (for example, having the same number of similarly-sized buffers in each path). FIG. 3B illustrates such an exemplary path. The pulse generation circuit 310 is coupled to the pulse latch 390 through a buffer 395 and to the mimic latch 320 through a buffer 397. The buffer 395 and the buffer 397 are similarly sized.

The mimic latch 320 comprises a mimic storage circuit 322 which is coupled to the mimic storage node 326. The mimic storage circuit 322 has a topology which is substantially similar to that of the latch storage circuit 394. For example, both the mimic storage circuit 322 and the latch storage circuit 394 may comprise a circuit path including a pass gate (mainly diffusion capacitance) and a storage element (mainly gate capacitance) as will be explained further in subsequent embodiments. The mimic latch 320 receives as inputs the output pulse 302, the clock input 340 and the clock enable input 345. The mimic storage circuit 322 is configured to control the mimic storage node in response to the output pulse 302, the clock input 340 and the clock enable input 345.

After the mimic storage node 326 has made a transition in response to the output pulse 302 (for example, to a logic zero value), it may be reset (for example, to a logic high value) so that a pulse can be generated during a subsequent clock cycle. To this end, the pulser control circuit 330 receives as an input the clock input 340 and the clock enable input 345 and is coupled to the mimic storage node 326. When the pulser 300 is enabled (for example, when the clock enable input 345 is at a logic low value), the pulser control circuit 330 pulls the mimic storage node 326 up to a logic high value in response to a logic low value of the clock input 340. This resets the pulser and allows a new pulse to be generated in a subsequent clock cycle if the pulser is enabled. When the pulser 300 is disabled (for example, when the clock enable input 345 is at a logic high value), the pulser control circuit 330 holds the mimic storage node 326 at a logic low value, thus suppressing pulse generation.

The pulse latch 390 is coupled to the pulse generation circuit 310 and is configured to receive the output pulse 302 therefrom. In response to the output pulse 302, the pulse latch 390 is configured to write the data 392 into the latch storage circuit 394. As described above, in a preferred embodiment the latch storage circuit 394 has a topology which is substantially similar to that of the mimic storage circuit 322.

Assuming the pulser 300 is enabled, a rising edge on the output pulse 302 causes the pulse latch 390 to initiate a write of the data 392 to the latch storage circuit 392 and causes the mimic latch 320 to initiate a write of a logic zero value to the mimic storage node 326 through the mimic storage circuit 322. The completion of the write of the logic low value into the mimic storage node 326 causes the pulse generation circuit 310 to terminate the output pulse 302, which terminates the write of the data 392 to the latch storage circuit 394. Because the mimic storage circuit 322 and the latch storage circuit 394 have a substantially similar topology, the amount of time (and thus, the pulse width) required to write a value into the mimic storage node 326 is substantially similar to that required to write a value into the pulse latch 390. As a result, the behaviors of the mimic storage circuit 322 and the latch storage circuit 394 track in a substantially similar manner across the PVT corners and the pulse generated by the pulse generation circuit 310 should be of sufficient duration to allow the pulse latch 390 to capture the value of the data 392 at the latch storage circuit 394.

During operation of the pulser 300, pulse generation is terminated by a feedback path to the pulse generation circuit 310. This feedback path through the mimic storage circuit 322 can provide more robust pulse generation across PVT corners. The integration of the clock enable input 345 into both the pulser control circuit 330 and the mimic latch 320 may simplify the timing requirements for the clock enable input 345 by replacing a hold time requirement for the clock enable input 345 to the falling edge of the clock input 340 (which is difficult to know with certainty) with a setup time to the rising edge of the clock input 340. From a timing perspective, this allows the clock enable input 345 to be sensitive to the rising edge of the clock input 340 instead of the falling edge of the clock input 340. Because a setup time to the rising edge of the clock input 340 may be known with more certainty than a hold time requirement to the falling edge of the clock input 340, the pulser 300 may be disabled across a wider range of conditions in which pulse generation is not needed and thus reduce overall power consumption. Finally, because the mimic storage circuit 322 and the latch storage circuit 394 share a substantially similar topology, the pulser 300 may more accurately track the behavior of the pulse latch 390 across PVT corners.

Figure 4:
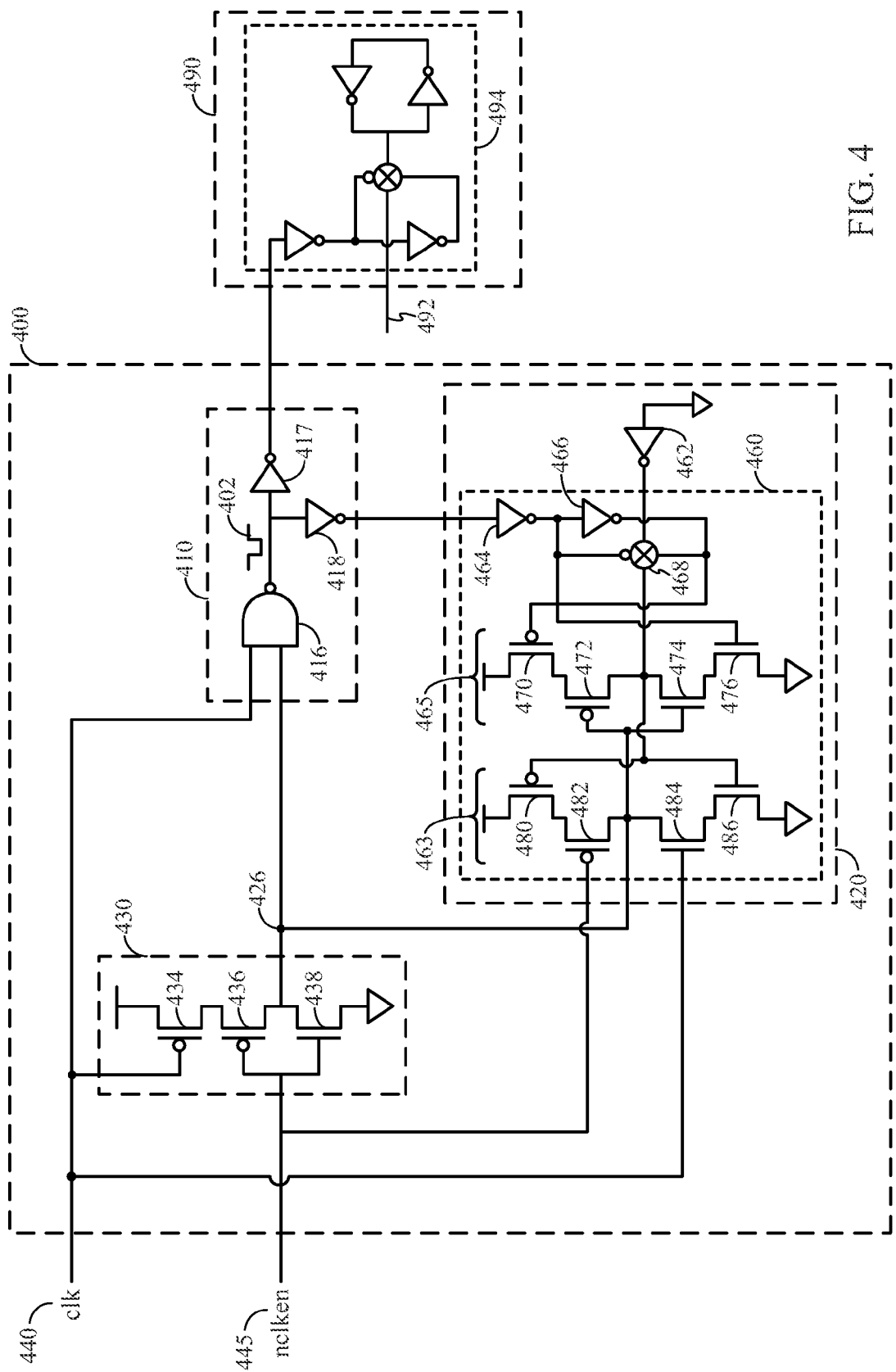
FIG. 4 is a circuit diagram of a pulser according to one embodiment.

FIG. 4 is a circuit diagram of a pulser 400 coupled to a pulse latch 490 according to one embodiment. The pulser 400 receives a clock input 440 and a clock enable input 445, and is configured to provide an output pulse 402 to the pulse latch 490 in order to allow the pulse latch 490 to capture the value of data 492 at a latch storage circuit 494. The pulser 400 comprises a pulse generation circuit 410, a mimic latch 420 and a pulser control circuit 430. The pulser 400 and its individual components may operate in a manner generally similar to that described in reference to the pulser 300 of FIG. 3A.

The pulse generation circuit 410 is coupled to the clock input 440 and a mimic storage node 426. The pulse generation circuit comprises a NAND gate 416 which generates the output pulse 402. The NAND gate 416 is coupled to inverters 417 and 418 which provide the output pulse 402 to the pulse latch 490 and the mimic latch 420. In one embodiment, inverters 417 and 418 are similarly sized so that the output pulse 402 is delayed by a similar amount of time before arriving at the pulse latch 490 and the mimic latch 420. When the pulser 400 is enabled, the NAND gate 416 begins the generation of the output pulse 402 in response to the clock input 440, which is distributed to inverters 417 and 418.

The mimic latch 420 comprises a mimic storage circuit 460 and an inverter 462 coupled to the mimic storage circuit 460 and to a logic low level (for example, ground). Mimic storage circuit 460 comprises inverters 464 and 466 which generate internal control signals and a pass gate 468 coupled to the output of the inverter 462 and the mimic storage node 426 and controlled by the internal control signals generated by inverters 464 and 466. Mimic storage circuit 460 further comprises a first tri-stateable inverter 463 and a second tri-stateable inverter 465. The first tri-stateable inverter 463 comprises PMOS device 480, PMOS control device 482, NMOS control device 484 and NMOS device 486 coupled in series between a logic high value (for example, Vdd) and a logic low value (for example, ground). A control terminal of PMOS control device 482 is coupled to the clock enable input 445, and a control terminal of NMOS control device 484 is coupled to the clock input 440. The control terminals of PMOS device 480 and NMOS device 486 are coupled to the output of the pass gate 468. The second tri-stateable inverter 465 comprises PMOS control device 470, PMOS feedback device 472, NMOS feedback device 474 and NMOS control device 476 coupled in series between a logic high value and a logic low value. A control terminal of PMOS control device 470 is coupled to the output of the inverter 466, and a control terminal of NMOS control device 476 is coupled to the output of the inverter 464. The output terminals of PMOS control device 482 and NMOS control device 484 are coupled to the mimic storage node 426 and to the control terminals of PMOS feedback device 472 and NMOS feedback device 474. The output terminals of PMOS feedback device 472 and NMOS feedback device 474 are coupled to the output of the pass gate 468 and to the control terminals of PMOS device 480 and NMOS device 486. This arrangement provides the mimic storage circuit 460 and the latch storage circuit 494 with a substantially similar topology. Likewise, the two inverters which control the pass gate of the pulse latch 490 may be sized similarly to inverters 464 and 466. In some embodiments, the components of both mimic storage circuit 460 and latch storage circuit 494 may be similarly sized in order to track PVT corners more closely. The two inverters which store state in the latch storage circuit 494 may be tri-stateable inverters having a similar topology to tri-stateable inverters 463 and 465. In other embodiments, inverter 463 and the two inverters which store state in the latch storage circuit 494 may be non-tristateable inverters. Similarity in topology between mimic storage circuit 460 and latch storage circuit 494 allows robust pulse generation as previously described in reference to FIG. 3A.

When the output pulse 402 is received at the mimic storage circuit 460, inverters 464 and 466 generate complementary internal control signals which open pass gate 468. This allows the mimic storage node 426 to begin to discharge to ground through NMOS control device 484 and NMOS device 486. The second tri-stateable inverter 465 is tri-stated by the application of the complementary internal control signals to PMOS control device 470 and NMOS control device 476, which allows the mimic storage node 426 to discharge to ground without interference from the second tri-stateable inverter 465. This may reduce power consumption in the pulser 400.

The pulser control circuit 430 is coupled to the clock input 440 and clock enable input 445. The pulser control circuit 430 comprises PMOS devices 434 and 436 and NMOS device 438 coupled in series between a logic high value and a logic low value. The control terminal of PMOS device 434 is coupled to the clock input 440. The control terminals of PMOS device 436 and NMOS device 438 are coupled to the clock enable input 445. In a particular embodiment, when the pulser 400 is enabled (for example, when the clock enable input is at a logic low value), the pulser control circuit 430 resets the mimic storage node 426 by pulling it to a logic high value through PMOS device 434 and PMOS device 436 in response to a logic low value on the clock input 440. The NMOS control device 484 in the mimic storage circuit 460 turns off in response to the logic low value on the clock input 440 to allow the pulser control circuit 430 to pull the mimic storage node 426 to a logic high value without interference from the mimic storage circuit 460. In some embodiments, this may reduce power consumption in the pulser 400. When the pulser 400 is not enabled (for example, when the clock enable input is at a logic high value), the mimic storage node 426 is held at a logic low value through NMOS device 438 in order to suppress pulse generation by the pulser 400.

Although the previous figures have illustrated particular embodiments of pulse generation circuits, the inventive concepts are not so limited. Other features not heretofore described may be included without departing from the inventive concepts described in reference to the disclosed embodiments. For example, in some embodiments the pulser control circuit 430 may further comprise a shift or test enable input, and may be configured to suppress pulse generation in response to an indication that a circuit including the pulser 400 is in a test mode. Those having skill in the art will recognize that other inputs to the pulser control circuit 430 such as shift or test enable inputs may be implemented in a manner similar to the clock enable input 445, depending on the particular logical function of the other inputs that is desired. In other embodiments where power consumption is of less concern, the clock enable input 445 and related circuitry may be omitted. Although the clock enable input 445 is illustrated as a negative-active signal, in some embodiments it may be positive-active depending on design choices. These and other configurations consistent with the disclosed inventive concepts will be apparent to those having skill in the art.

Figure 5:
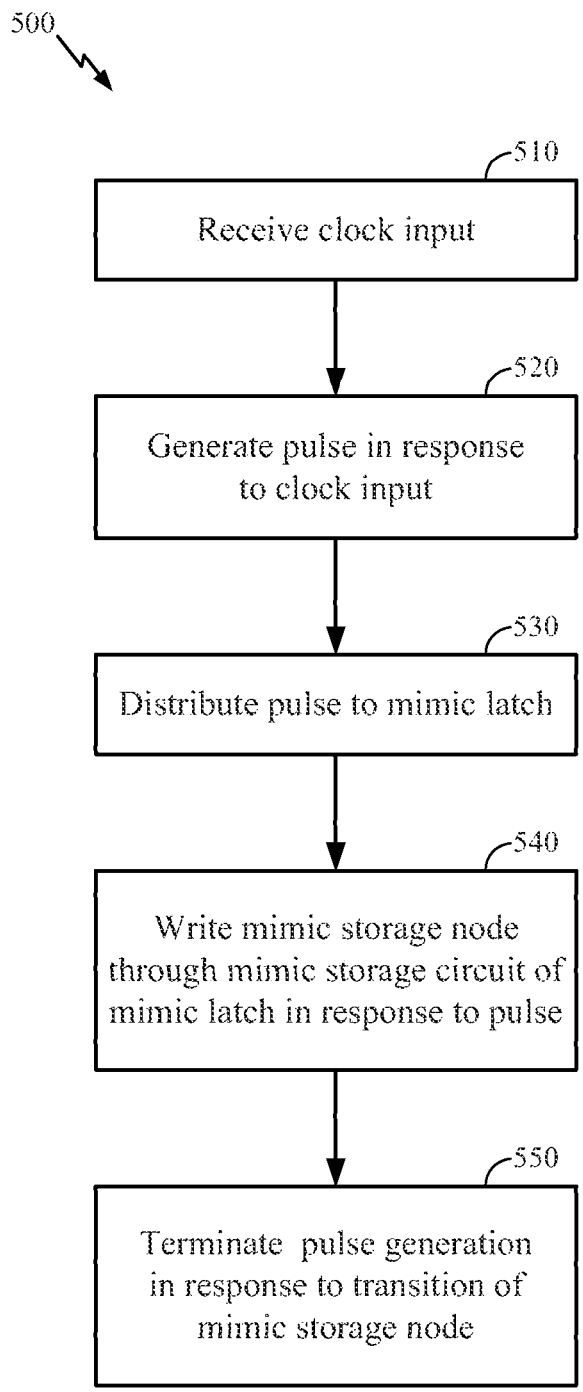
FIG. 5 is a block diagram of a method of generating a pulse according to one embodiment.

FIG. 5 illustrates a method of generating a pulse in accordance with the embodiments described her generally designated 500. In an exemplary embodiment, the pulse is of sufficient duration to write a pulse latch such as pulse latch 490.

In block 510, a clock input is received at a pulse generation circuit. For example, the clock input 440 is received at the pulse generation circuit 410. In some embodiments a clock enable input may be received at a pulser control circuit coupled to the pulse generation circuit, and pulse generation may be enabled or disabled based on first and second logic values of the clock enable input. For example, the clock enable input 445 is received at the pulser control circuit 430 which is coupled to the pulse generation circuit 410. The pulser control circuit 430 may enable or disable pulse generation at the pulse generation circuit 410 in response to the clock enable input 445.

In block 520, a pulse is generated in response to the clock input. For example, NAND gate 416 generates the output pulse 402 in response to the clock input 440.

In block 530, the pulse is distributed to a mimic latch. For example, the inverter 418 provides the pulse 402 to mimic latch 420. In a further embodiment, the pulse is distributed, to a pulse latch. For example, the inverter 417 distributes the output pulse 402 to the pulse latch 490.

In block 540, the mimic latch causes a transition of a mimic storage node through a mimic storage circuit in response to the pulse. For example, mimic storage circuit 460 receives the output pulse 402 and causes a logic low value to be written to the mimic storage node 426 through the pass gate 462 in response to the output pulse 402. In one embodiment, the mimic storage circuit 460 has a topology which is substantially similar to a topology of a latch storage circuit 494 which is responsive to the output pulse 402.

In block 550, the pulse generation circuit terminates generation of the pulse in response to the transition of the mimic storage node. For example, the pulse generation circuit 410 terminates generation of the pulse in response to a logic low value being written into the mimic storage node 426. In sonic embodiments the mimic storage node may be reset to allow another pulse to be generated in a subsequent clock cycle. For example, the pulser control circuit 430 pulls the mimic storage node 426 up to a logic high value in response to a logic low value of the clock input 440.

While the teachings of the present disclosure are provided in the context of pulse generation circuits, it will be recognized that a wide variety of implementations may be employed by persons of ordinary skill in the art consistent with the teachings herein and the claims which follow below. Various embodiments may add, omit, rearrange, or modify the elements or steps described herein. For instance, if simulation of the pulser 400 and the pulse latch 490 indicates that a desired degree of tracking has not yet been achieved, the sizing of the devices making up inverters 417 and 418, the mimic storage circuit 460 and the latch storage circuit 494 may be adjusted to provide closer tracking between the pulse generated by the pulser 400 and the pulse width needed to write the pulse latch 490 The capacitive loading of the mimic storage node 426 may likewise be adjusted to shorten or lengthen the pulse generated by the pulser 400.

Moreover, the previous description of the disclosed, implementations is provided to enable any person skilled in the art to make or use the present disclosure. Various modifications to these implementations will be readily apparent to those skilled in the art, and the generic principles defined, herein may be applied to other implementations without departing from the spirit or scope of the disclosure. Thus, the present disclosure is not intended to be limited to the features shown herein but is to be accorded the widest scope consistent with the principles and novel features disclosed herein.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A pulser, comprising:
   a clock input;
   a pulse generation circuit;
   a mimic latch circuit; and
   a pulser control circuit;
   wherein the pulse generation circuit is coupled to the clock input and a mimic storage node and is configured to generate a pulse in response to the clock input and the mimic storage node;
   wherein the pulse generation circuit is configured to provide the pulse to the mimic latch circuit;

wherein the pulse generation circuit is configured to terminate generation of the pulse in response to a transition of the mimic storage node which indicates termination of pulse generation;

wherein the mimic latch circuit is coupled to the mimic storage node and is configured to cause the transition of the mimic storage node in response to the pulse; and wherein the pulser control circuit is coupled to the mimic storage node and is configured to reset the mimic storage node in response to the clock input.

2. The pulser of claim 1 further comprising a clock enable input coupled to the mimic latch circuit and to the pulser control circuit, wherein the pulser control circuit is configured to suppress pulse generation in response to the clock enable input.

3. The pulser of claim 2, wherein the clock enable input is sensitive to a rising edge of the clock input.

4. The pulse of claim 3, wherein the clock enable input is not sensitive to a falling edge of the clock input.

5. The pulser of claim 2, wherein the mimic latch circuit further comprises a mimic storage circuit which is configured to write a value to the mimic storage node in response to the pulse.

6. The pulser of claim 5, wherein the mimic storage circuit has a topology that is substantially similar to a topology of a latch storage circuit which is responsive to the pulse.

7. The pulser of claim 5, wherein the mimic storage circuit comprises a pass gate through which the value is written and a storage element configured to maintain a logic high value on the mimic storage node.

8. The pulser of claim 5, wherein at least a portion of the storage element is tri-stateable in response to at least one of the clock enable input and the clock input.

9. The pulser of claim 1 further comprising a shift input, wherein the pulser reset circuit is configured to suppress pulse generation in response to the shift input.

10. The pulser of claim 1, wherein the pulser control circuit is configured to suppress pulse generation by writing the value which indicates termination of pulse generation to the mimic storage node.

11. The pulser of claim 1 integrated into a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, or a portable digital video player.

12. A method of pulse generation, comprising:
receiving a clock input at a pulse generation circuit;
generating a pulse at the pulse generation circuit in response to the clock input;
distributing the pulse to a mimic latch;
writing a mimic storage node through a mimic storage circuit of the mimic latch in response to the pulse; and
terminating generation of the pulse at the pulse generation circuit in response to a transition of the mimic storage node.

13. The method of claim 12, further comprising receiving a clock enable input at a pulser control circuit coupled to the pulse generation circuit.

14. The method of claim 13, further comprising suppressing generation of the pulse in response to a first value of the clock enable input.

15. The method of claim 13, further comprising allowing generation of the pulse in response to a second value of the clock enable input.

16. The method of claim 12, further comprising distributing the pulse to a pulse latch.

17. The method of claim 16, further comprising writing a data value into a latch storage circuit of the pulse latch in response to the pulse.

18. The method of claim 17, wherein the mimic storage circuit has a topology which is substantially similar to a topology of the latch storage circuit.

19. The method of claim 18, further comprising resetting the mimic storage node to allow another pulse to be generated in a subsequent clock cycle.

20. An apparatus, comprising:
a clock input;
pulse generation means;
mimic latch means; and
pulser control means;
wherein the pulse generation means is coupled to the clock input and a mimic storage node and is configured to generate a pulse in response to the clock input and the mimic storage node;
wherein the pulse generation means is configured to provide the pulse to the mimic latch means;
wherein the pulse generation means is configured to terminate generation of the pulse in response to a transition of the mimic storage node which indicates termination of pulse generation;
wherein the mimic latch means is coupled to the mimic storage node and is configured to cause the transition of the mimic storage node in response to the pulse; and
wherein the pulser control means is coupled to the mimic storage node and is configured to reset the mimic storage node in response to the clock input.

* * * * *